(12) United States Patent
Dupuis (10) Patent No.: US 8,471,550 B2
(45) Date of Patent: Jun. 25, 2013

(54) DELIVERED POWER DETECTION FOR POWER AMPLIFIERS AND RELATED SYSTEMS AND METHODS

(75) Inventor: Timothy J. Dupuis, West Lake Hills, TX (US)

(73) Assignee: Javelin Semiconductor, Austin, TX (US)

(*) Notice: Subject to any disclaimer, the term of this patent is extended or adjusted under 35 U.S.C. 154(b) by 418 days.

(21) Appl. No.: 12/799,957

(22) Filed: May 5, 2010

(65) Prior Publication Data

US 2011/0273164 A1 Nov. 10, 2011

(51) Int. Cl.
*G01R 11/32* (2006.01)

(52) U.S. Cl.
USPC ......................................... 324/142

(58) Field of Classification Search
USPC ......... 324/762.01–762.1, 142, 127 R, 127 H; 257/48; 438/14–18
See application file for complete search history.

(56) References Cited

U.S. PATENT DOCUMENTS

| | | | |
|---|---|---|---|
| 5,434,537 A | 7/1995 | Kukkonen | 330/2 |
| 5,590,408 A | 12/1996 | Weiland et al. | 455/69 |
| 5,986,501 A * | 11/1999 | Rafati et al. | 330/254 |
| 6,212,367 B1 | 4/2001 | Tolson | 455/114 |
| 6,472,860 B1 | 10/2002 | Tran et al. | 324/76.11 |
| 6,531,860 B1 | 3/2003 | Zhou et al. | 324/105 |
| 6,597,244 B2 | 7/2003 | Tichauer | 330/298 |
| 6,759,922 B2 | 7/2004 | Adar et al. | 333/109 |
| 7,103,328 B2 | 9/2006 | Zelley | 455/115.3 |
| 7,392,021 B2 | 6/2008 | Jain et al. | 455/115.1 |
| 7,433,658 B1 * | 10/2008 | Shirvani-Mahdavi et al. | 455/127.2 |
| 7,466,160 B2 * | 12/2008 | Ong et al. | 324/750.3 |
| 7,738,845 B2 | 6/2010 | Takahashi et al. | 455/126 |
| 7,804,364 B2 | 9/2010 | Dupuis et al. | 330/297 |
| 7,869,773 B2 | 1/2011 | Kuijken | 455/127.1 |
| 7,933,570 B2 | 4/2011 | Vinayak et al. | 455/127.1 |
| 2008/0157786 A1 * | 7/2008 | Holt et al. | 324/679 |
| 2009/0273397 A1 | 11/2009 | Bockelman et al. | 330/51 |
| 2009/0278609 A1 | 11/2009 | Srinivasan et al. | 330/297 |
| 2010/0201346 A1 | 8/2010 | You | 324/123 |
| 2010/0327927 A1 | 12/2010 | Nagarkatti et al. | 327/164 |

* cited by examiner

*Primary Examiner* — Tung X Nguyen
(74) *Attorney, Agent, or Firm* — O'Keefe, Egan, Peterman & Enders LLP (57) ABSTRACT

Delivered power detection for power amplifiers (PAs) and related systems and methods are disclosed. The disclosed embodiments and techniques provide a delivered power indication for systems using PAs, including such systems for cellular telephone applications, allow power detection circuitry to be integrated on the same integrated circuit die as the PA, and provide power detection circuitry with output signals at baseband frequencies. In one embodiment, the delivered power detection circuitry includes output voltage level detection circuitry and output current level detection circuitry that provide current signals to multiplier circuitry, which in turn provides current output signals proportional to the actual delivered power to the load as represented by the incident power to the load reduced by the reflected power.

38 Claims, 7 Drawing Sheets

DELIVERED POWER DETECTION FOR POWER AMPLIFIERS AND RELATED SYSTEMS AND METHODS

TECHNICAL FIELD OF THE INVENTION

This invention relates to power amplifiers and, more particularly, to radio frequency (RF) power amplifiers for signal transmission in wireless devices.

BACKGROUND

In wireless communication devices, radio frequency (RF) power amplifiers (PAs) are often used to provide transmit signals at increased power levels needed for operation within a communication system. For example, cellular telephone devices use PAs to transmit signals at power levels needed to communicate effectively with cellular base stations. In addition, these transmit power levels must often be controlled or limited by the communication device to meet regulatory requirements. As such, in a cellular telephone application, there is a need to detect the power output of the PA that is delivered to the antenna. In prior communication devices, a directional RF coupler has been used to split off a proportional part of the transmit output signal so that the transmit output power can be monitored by the system.

Figure 1:
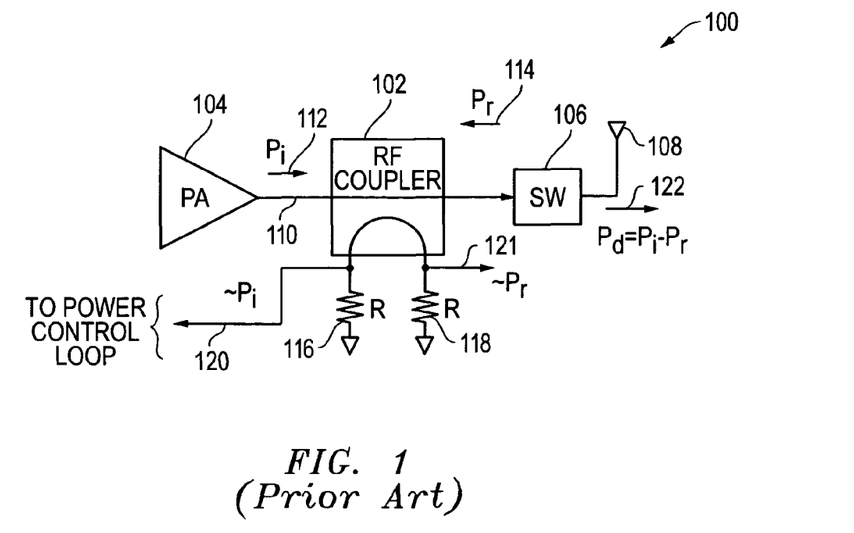
FIG. 1 (Prior Art) is a diagram of an embodiment for a prior technique for providing an indication of output power based upon incident power provided to an antenna.

FIG. 1 (Prior Art) is a block diagram of an embodiment 100 for the use of a directional RF coupler 102 to provide information concerning delivered power back to a host processor for use in a power control loop. As depicted, a PA 104 sends a transmit signal 110 through the RF coupler 102 and through antenna switch circuitry (SW) 106 to antenna 108, which serves as the load for the transmit signal. The incident power (Pi) delivered from the PA 104 to the antenna 108 through the RF coupler 102 and switch circuitry (SW) 106 is represented by arrow 112. The RF coupler 102 includes a loop between resistors (R) 116 and 118 that provides a first output 120 that is proportional to the incident power (Pi) 112 and a second output 121 that is proportional to the reflected power (Pr) 114. Resistors (R) 116 and 118 can be coupled to ground and can be matched resistors, for example, set at 50 ohms.

Prior systems use the first output 120 from the direct RF coupler 102 to represent the power delivered to the antenna 108. This first output 120, which is proportional to the incident power (Pi) 112, is then provided to a power control loop used by host processors to control the output power to the antenna 108 for these prior systems. Because this first output 120 is at RF frequencies, an RF receiver and down-converter are used by host processors to reduce the first output signal 120 to baseband frequencies.

One problem with these prior solutions is that the actual delivered power (Pd) 122 to the antenna 108 is typically less than the incident power (Pi) 112 due to reflected power (Pr) 114. Power will be reflected back, thereby reducing the actual power delivered to the antenna 108, if there are load mismatches, such as mismatches associated with the antenna 108. Because such mismatches typically exist, the actual delivered power (Pd) 122 is the incident power (Pi) 112 reduced by the reflected power (Pr) 114 as represented by the equation Pd=Pi−Pr. As such, the output power indicator used by prior solutions is not accurate because it is proportional to the incident power (Pi) 112 and ignores the reflected power (Pr) 114. In short, the first output 120 used by prior solutions indicates a larger delivered power than is actually occurring because it is proportional to the incident power (Pi) 112 and does not consider the reflected power (Pr) 114.

Another problem with these prior solutions is that directional RF couplers are difficult to integrate because they include large passive components, high Q transformers and capacitors, or coupled transmission lines. Further, as indicated above, the output signals from directional RF couplers are at RF frequencies and require a RF receiver and down-converter in the power detection loop used by the host system to bring those signals to baseband so that they can more easily be used by the host processor to control the output power of the PA. While a prior system could use both the first output 120 and the second output 121 from the directional RF coupler 102 in an effort to determine an actual delivered power (Pd), such a solution would still be difficult to integrate due to the use of the directional coupler 102. Further, an RF receiver and down-converter would need to be provided for both the first and second outputs 120 and 121.

It is desirable, therefore, to provide a more accurate delivered power indication for systems using PAs, including such systems for cellular telephone applications. It is also desirable to have delivered power detection circuitry which can be integrated on the same integrated circuit die as the PA circuitry or other integrated circuitry or can be included within the same semiconductor package for the PA. Further, it is desirable to have delivered power detection circuitry that provides its output signals at baseband frequencies.

SUMMARY OF THE INVENTION

Delivered power detection for power amplifiers (PAs) and related systems and methods are disclosed. The disclosed embodiments and techniques provide accurate delivered power indications for systems using PAs, including such systems for cellular telephone applications, allow delivered power detection circuitry to be integrated on the same integrated circuit die as the PA, and provide delivered power detection circuitry with output signals at baseband frequencies. Additional advantages are also provided by the embodiments disclosed that advantageously provide delivered power indication circuitry that outputs signals indicative of the actual delivered power.

In one embodiment, a system is provided for providing radio frequency (RF) transmit signals that includes power amplifier circuitry configured to output an RF transmit signal to a load, and delivered power detection circuitry configured to detect power delivered by the RF transmit signal to the load and to provide an output signal indicative of the power delivered, the output signal being representative of incident power to the load reduced by reflected power. The system can further including a host processor configured to receive the output signal from the delivered power detection circuitry, where the host processor has a power control loop configured to use the output signal to control transmit power provided by the power amplifier circuitry to the load. Still further, the RF transmit signal can be configured to be at a frequency of about 0.8 GHz or above, and the output signal indicative of the power delivered can be at baseband.

In a further embodiment, the delivered power detection circuitry can include voltage detection circuitry configured to detect a voltage level associated with a signal line for the RF transmit signal and current detection circuitry configured to detect a current associated with a signal line for the RF transmit signal. Further, multiplier circuitry can be coupled to receive an output signal from the voltage detection circuitry and an output signal from the current detection circuitry, where the multiplier circuitry is configured to provide a combined output signal indicative of the delivered power. Still further, the output signal from the voltage detection circuitry, the output signal from the current detection circuitry, and the output signal from the multiplier circuitry can all be current signals. In addition, the RF transmit signal and the output signals from the voltage detection circuitry and the current detection circuitry can be at about 0.8 GHz or above, and the output signals from the multiplier circuitry can include baseband frequencies.

In another embodiment, a delivered power detector is provided for radio frequency (RF) transmit signals that includes delivered power detection circuitry configured to detect power delivered by an RF transmit signal to a load and to provide an output signal indicative of the power delivered, where the output signal is representative of incident power to the load reduced by reflected power. In further embodiments, the delivered power detection circuitry can include voltage detection circuitry configured to detect a voltage level associated with a signal line for the RF transmit signal and current detection circuitry configured to detect a current associated with a signal line for the RF transmit signal. The delivered power detection circuitry can further include multiplier circuitry coupled to receive an output signal from the voltage detection circuitry and an output signal from the current detection circuitry, where the multiplier circuitry is configured to provide a combined output signal indicative of the delivered power. Further, the output signals from the voltage detection circuitry and the current detection circuitry can be at about 0.8 GHz or above, and the output signals from the multiplier circuitry can include baseband frequencies.

In still a further embodiment, a method is disclosed for providing radio frequency (RF) transmit signals including generating an amplified RF transmit signal for a load, detecting power delivered by the RF transmit signal to the load, and providing an output signal indicative of the power delivered, where the output signal is representative of incident power to the load reduced by reflected power. Further, the output signal indicative of the power delivered to control transmit power to the load. In addition, the detecting step can include detecting a voltage level associated with a signal line for the RF transmit signal, outputting a signal indicative of the voltage level, detecting a current associated with a signal line for the RF transmit signal, and outputting a signal indicative of the current level. Still further, the providing step can include multiplying the signal indicative of the voltage level with the signal indicative of the current level to provide the output signal indicative of the power delivered. The RF transmit signal, the signal indicative of the voltage level, and the signal indicative of the current level can also be at about 0.8 GHz or above, and the output signal indicative of the power delivered can be at baseband.

In still further embodiments, the power amplifier circuitry and the delivered power detection circuitry can be included with the same semiconductor package. Further, the power amplifier circuitry and the delivered power detection circuitry can be integrated within the same integrated circuit. The power amplifier circuitry and the delivered power detection circuitry can also be fabricated using CMOS processing. The delivered power detection circuitry can further include bipolar transistors formed as parasitic NPN devices during the CMOS processing.

Other features and variations can be implemented, if desired, and related systems and methods can be utilized, as well.

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

Delivered power detection for power amplifiers and related systems and methods are disclosed. In part, the disclosed embodiments provide techniques for detecting the delivered power without having to use a directional radio frequency (RF) coupler. These techniques can be used for high transmit frequencies including frequencies at about 0.8 GHz and above, such as those used for cellular telephone systems. These systems, methods and techniques can be implemented using CMOS semiconductor processing and, if desired, can utilize bipolar transistors also formed using CMOS semiconductor processing. For example, parasitic NPN transistors formed from the CMOS processing can be used to provide bipolar transistors used within the delivered power detection circuitry. Advantageously, the delivered power detection circuitry can be integrated on the same integrated circuit with other CMOS circuitry, such as being integrated on the same integrated circuit with a CMOS power amplifier.

Figure 2:
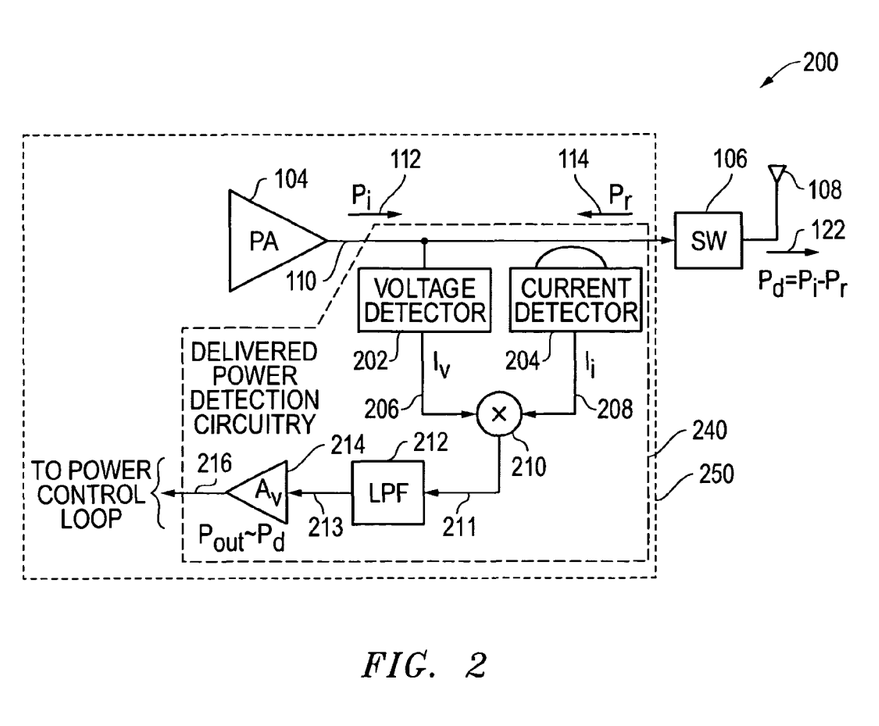
FIG. 2 is a diagram of an embodiment for providing an indication of output power based upon actual delivered power from a power amplifier to an antenna.
Figure 3:
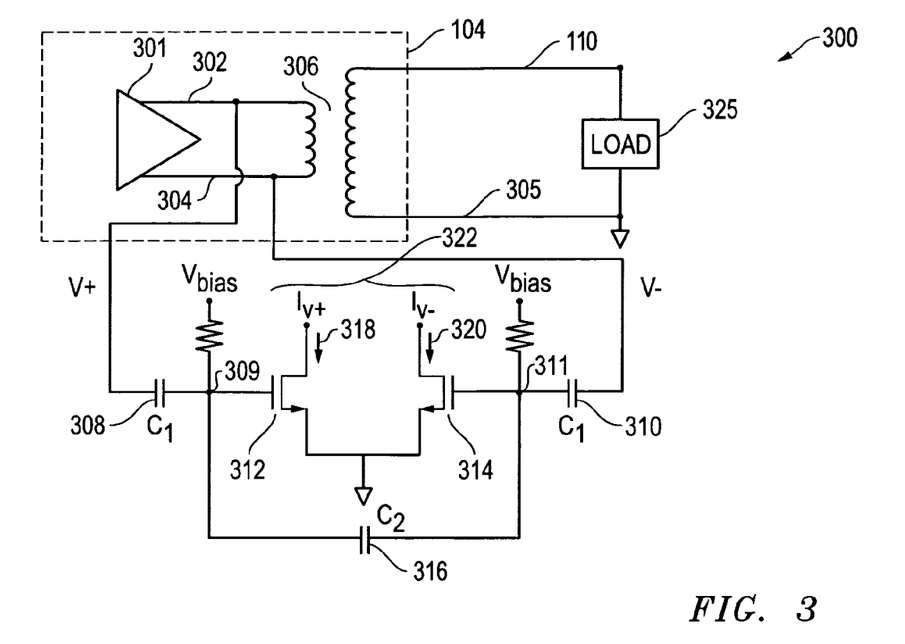
FIG. 3 is a diagram of an embodiment for voltage detection circuitry associated with the delivered power detector of FIG. 2.
Figure 4:
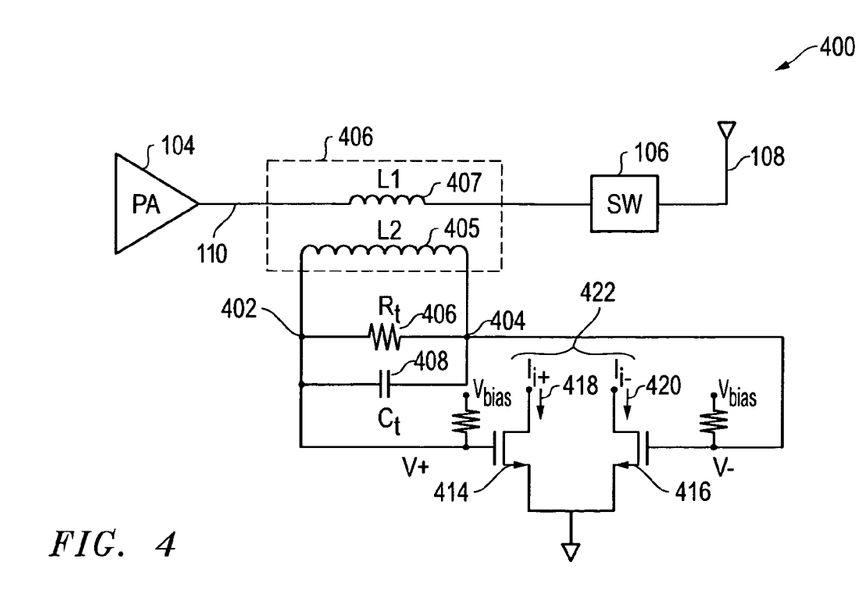
FIG. 4 is a diagram of an embodiment for current detection circuitry associated with the delivered power detector of FIG. 2.
Figure 5:
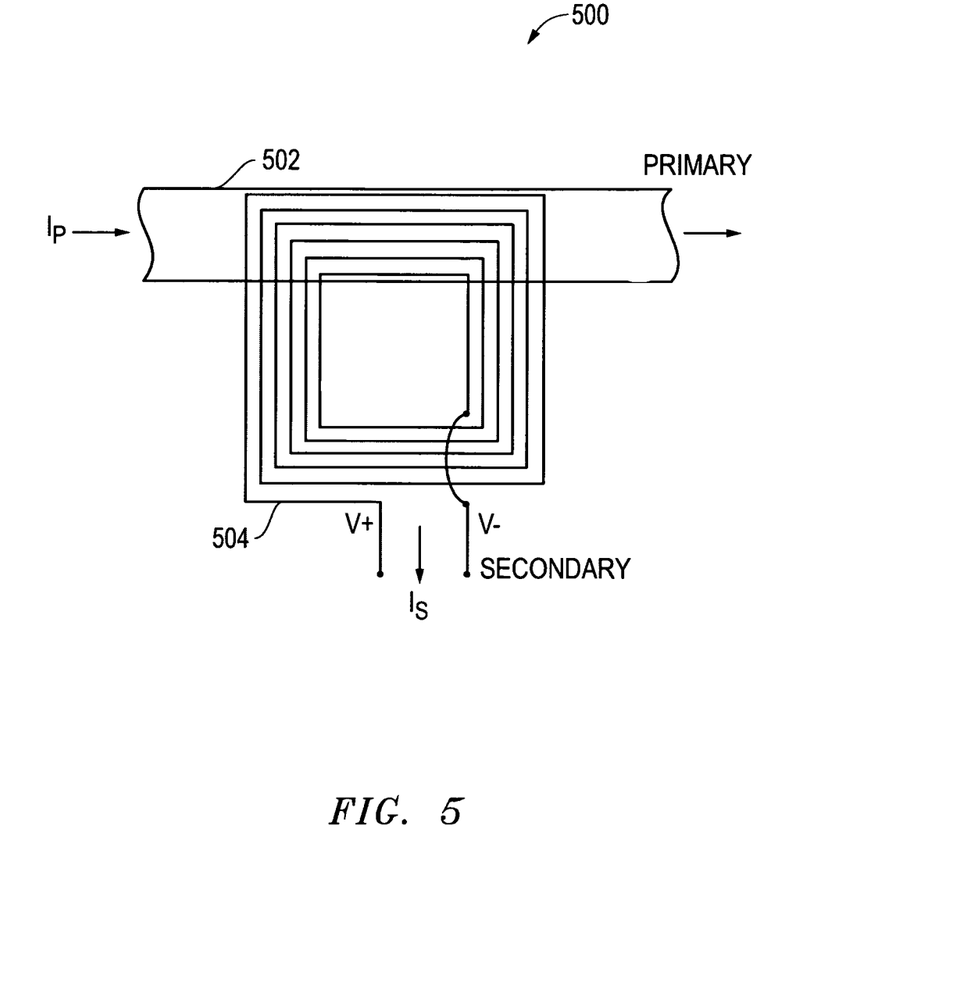
FIG. 5 is a diagram of an embodiment for coupled inductors for the current detection circuitry of FIG. 4.
Figure 6:
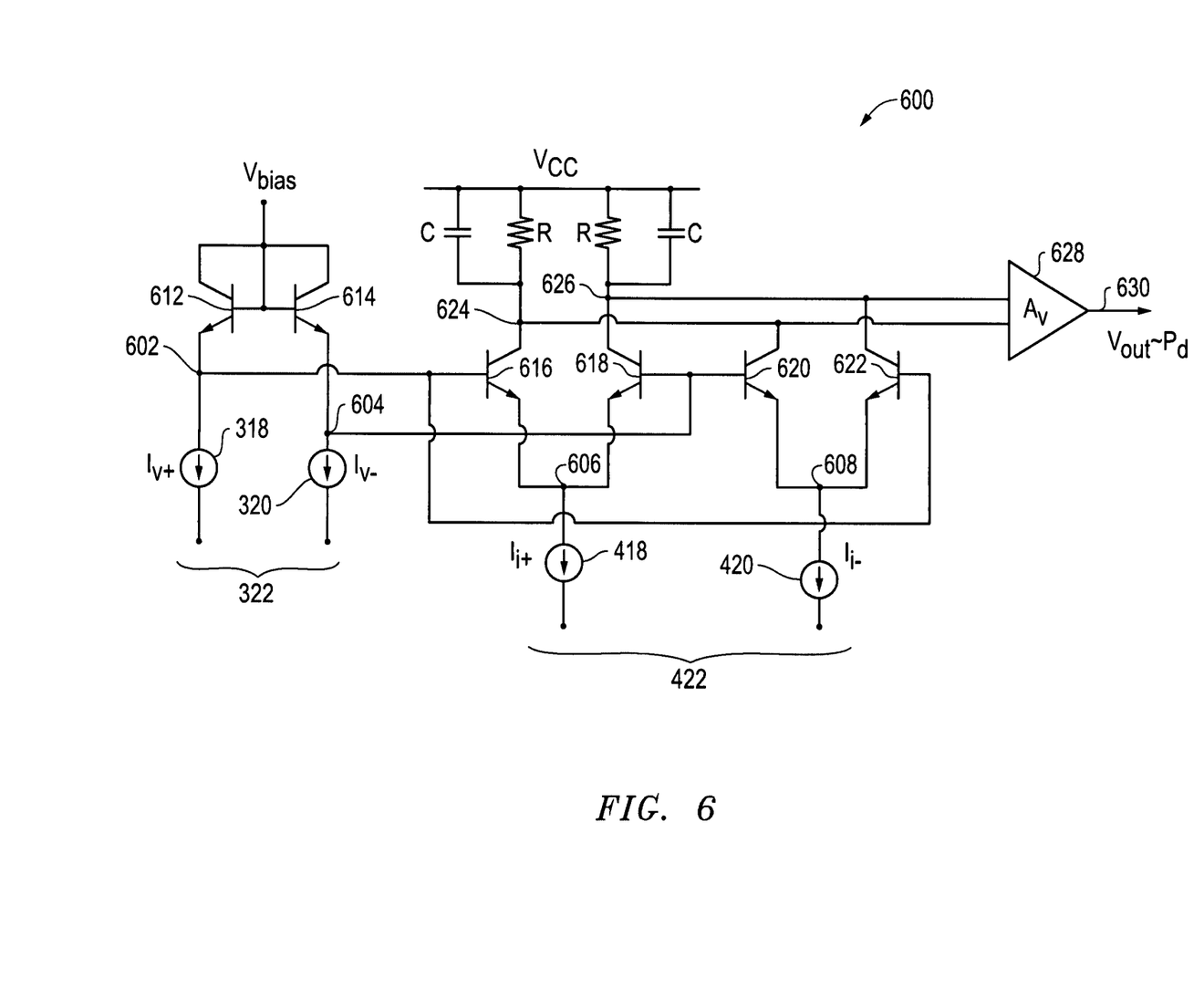
FIG. 6 is a diagram of a embodiment for multiplier circuitry that can be used for current output signals associated with the voltage detection circuitry and current detection circuitry of FIGS. 3-4.
Figure 7:
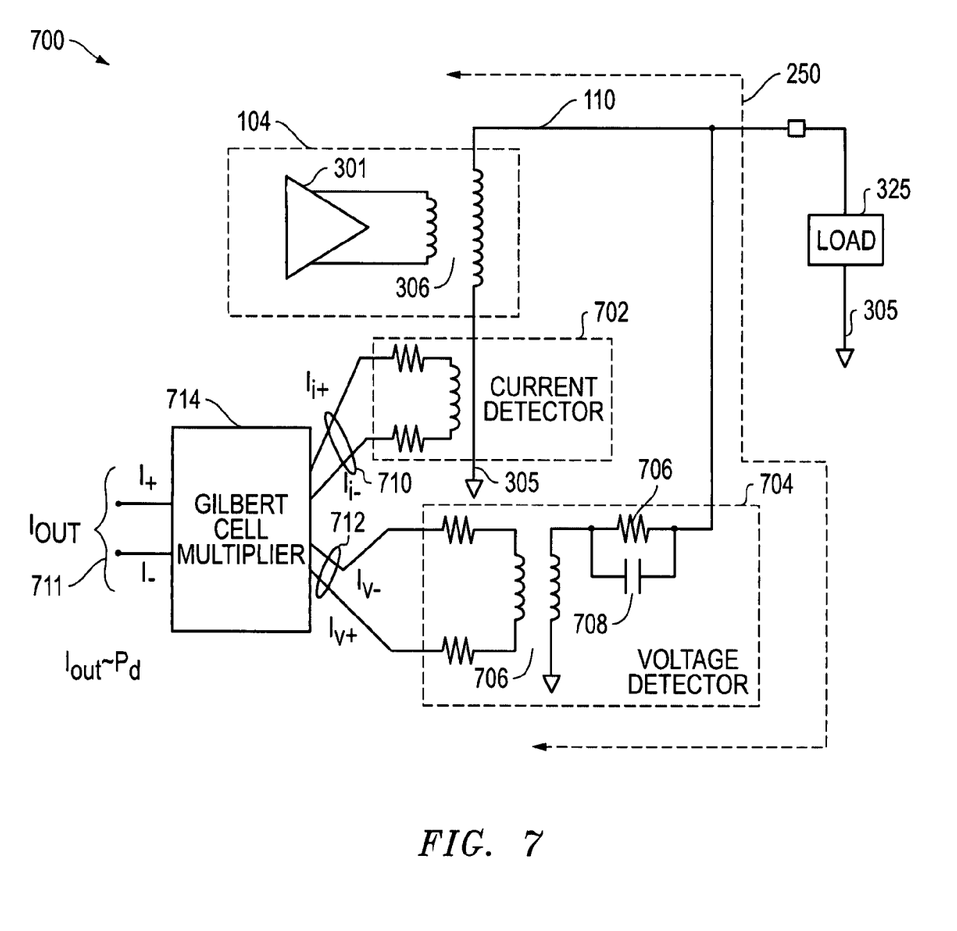
FIG. 7 is a diagram of an embodiment for alternative implementations for the current detection circuitry and the voltage detection circuitry.
Figure 8:
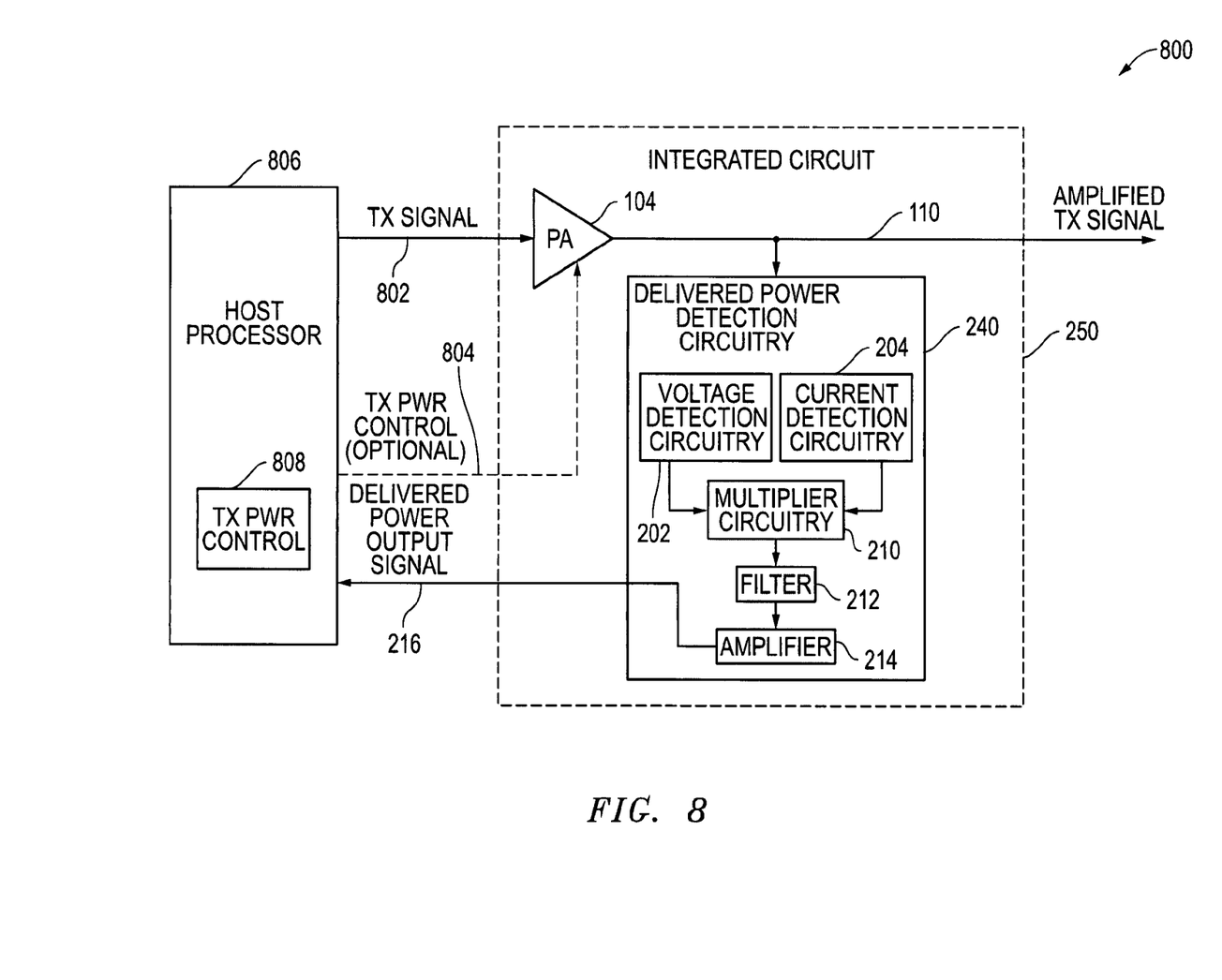
FIG. 8 is a diagram of an example embodiment for a system including delivered power detection circuitry.
Figure 9:
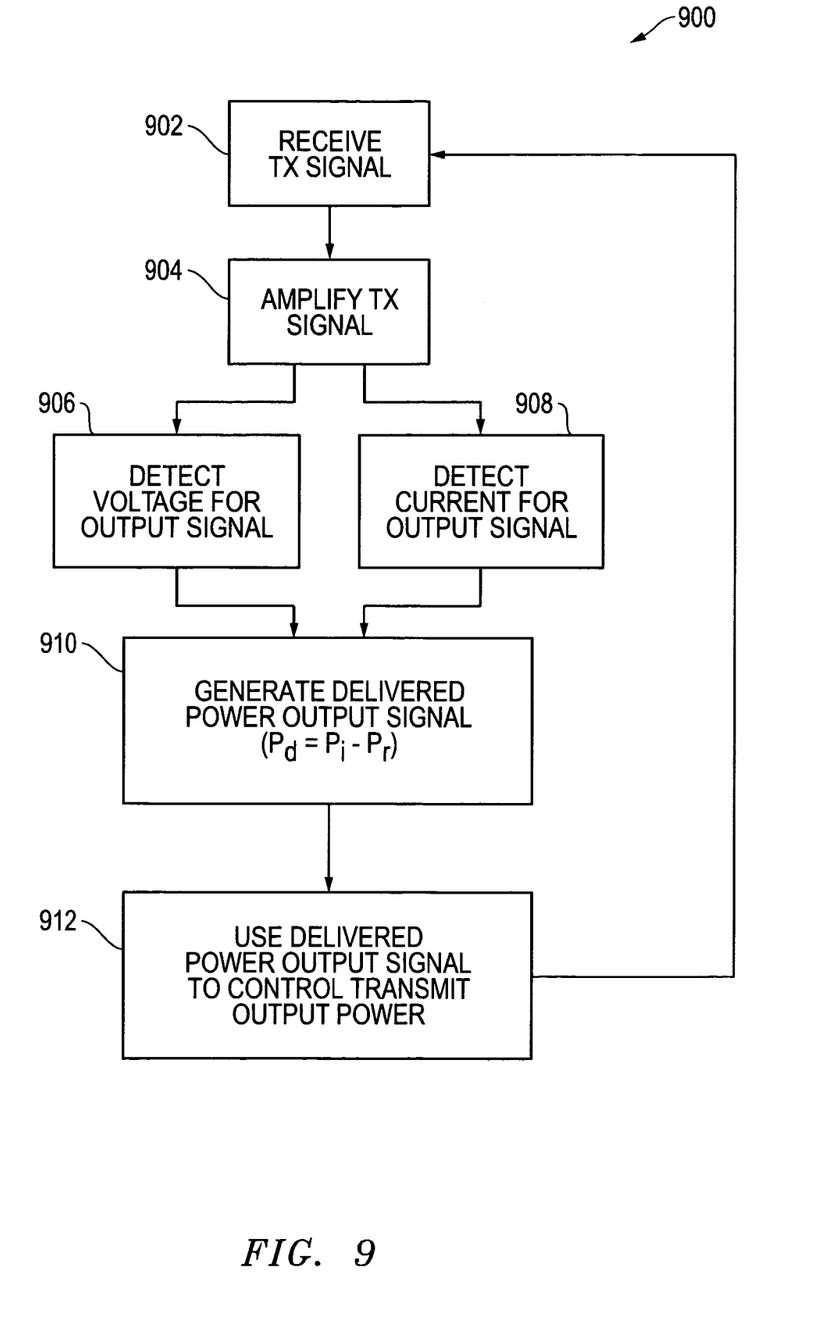
FIG. 9 is a process flow diagram of an example embodiment for controlling transmit output power using a delivered power detection signal.

Example embodiments are described with respect to FIGS. 2-9 as described in more detail below. FIG. 2 provides an example embodiment for delivered power detection circuitry that produces an output signal that is proportional to the actual delivered power to a load. FIG. 3 provides an example embodiment for voltage detection circuitry that can be used in the embodiment of FIG. 2. FIG. 4 provides an example embodiment for current detection circuitry that can be used in the embodiment of FIG. 2. FIG. 5 provides an example embodiment for coupled inductors that can be used for the current detection circuitry of FIG. 4. FIG. 6 provides an example embodiment for multiplier circuitry that can be used with the embodiments of FIGS. 3-4. FIG. 7 provides an embodiment for alternative implementations for the current detection circuitry and the voltage detection circuitry. FIG. 8 provides an example embodiment for a system including delivered power detection circuitry. FIG. 9 provides an example embodiment for controlling transmit output power using a delivered power output signal. These embodiments are not to be considered as limiting, and other features and variations can also be implemented, if desired, and related systems and methods can be utilized, as well.

FIG. 2 is a diagram of an embodiment 200 for providing an output signal 216 representing the actual delivered power by a transmit signal 110 from a power amplifier (PA) 104 to a load, such as an antenna 108. In contrast with prior systems as shown in FIG. 1 (Prior Art), a directional RF coupler 102 does not need to be used for the embodiment 200 of FIG. 2. Rather, delivered power detection circuitry 240 is utilized to provide an output signal that represents the actual delivered power (Pd) 122. In the embodiment depicted, the delivered power detection circuitry 240 includes a voltage detector 202 and a current detector 204 that are used to provide output signals 206 and 208 that are combined by multiplier 210 to provide an output signal 211 that is proportional to the actual delivered power (Pd) 122 to the antenna 108. As such, the output signal 211 is representative of the incident power (Pi) 112 to the load 108 as reduced by the reflected power (Pr) 114. As shown, the output signal 211 can also be filtered and amplified, if desired, to produce an output power indication signal (Pout) 216 that is proportional the actual delivered power (Pd) 122.

Looking further to FIG. 2, the output power indication signal (Pout) 216 is based upon a voltage level and a current level detected with respect to the transmit signal 110 being provided by the PA 104. As depicted, a voltage detector 202 detects the voltage level associated with the transmit signal 110 from the PA 104 and provides an output signal, such as a current signal (Iv) 206, that is related to this voltage level. A current detector 204 detects the current level associated with the transmit signal 110 from the PA 104 and provides an output signal, such as current signal (Ii) 208, that is related to this current level. The voltage-related current signal (Iv) 206 and the current-related current signal (Ii) 208 are provided to multiplier 210. The multiplier 210 combines the two output signals 206 and 208 and provides a combined signal, such as a current signal 211, as an output that is proportional to the actual delivered power (Pd) 122. Advantageously, while the output signals 206 and 208 are at RF frequencies, the output current signal 211 from the multiplier circuitry 210 can include baseband frequencies.

It is noted that the multiplier circuitry 210 in effect operates as a de-modulator. The result of multiplying two RF signals is signal components at baseband and at the second harmonic, which comes from the identity: $(\sin(x)*\sin(x))=(1-\cos(2x))/2$. In the embodiment 200, the output signal 211 from multiplier circuitry 210, therefore, would include signal components at baseband and at the second harmonic. The second harmonic component can then be filtered out by a low pass filter (LPF) 212, thereby leaving only the baseband frequencies. In a cellular handset environment, the baseband frequencies would include a frequency range within which the transmit signal power is being modulated, and this power modulation would typically contain the coded digital signal that the cellular handset is sending. For example, in WCDMA cellular environments, this frequency range for power modulation is about 2 Mhz, where the RF carrier signal is about 800 MHz. For this WCDMA environment, the output signal 211 from the multiplier circuitry 210 would include power modulation within a range of frequencies from about 0-2 MHz (baseband) and within a range of frequencies from about 1600±4 MHz (second harmonic), assuming again that the carrier frequency is 800 MHz. After the LPF 212, the signal 213 would include only signals at baseband.

Looking back to FIG. 2, this current output signal 211 from the multiplier 210 is provided to a low pass filter (LPF) 212 and then to an amplifier (Av) 214. As described above, the LPF 212 can operate to remove the second harmonic from the output signal 211 so that the output signal 213 from the LPF 212 includes only the baseband component. The output of the amplifier (Av) 214 provides an output power indication signal (Pout) 216 that is also at baseband. This output power indication signal (Pout) 216 can be used by a power control loop within a host processor, for example, to control the output power provided to the load, such as antenna 108. In contrast to prior solutions, the output power indication signal (Pout) 216 is proportional to the actual delivered power (Pd) 122. Further, because the output power indication signal (Pout) 216 is at baseband, the need for an RF receiver and down-converter in the power control loop circuitry is eliminated.

In operation, the embodiment 200 provides a direct indication of the actual delivered power (Pd) 122 to the antenna 108 or load from the transmit signal 110 generated by the PA 104. The voltage levels and current levels detected and multiplied are at the output RF frequencies, and these RF frequencies can be at about 0.8 GHz or above, if desired. The output signals from the multiplier circuitry, however, include baseband frequencies. The output power waveform from the multiplier circuitry can also be filtered and amplified to give a voltage which is proportional to the average delivered power to the antenna/load. These delivered power detection techniques thereby provide a significant advantage over prior solutions that represented incident power (Pi) 112 as an indication of delivered power.

The delivered power detection circuitry described herein also allows for the circuitry to be fabricated with CMOS processing. In particular, the delivered power detection circuitry 240, including the voltage detector circuitry 202 and the current detector circuitry 204, as well as the multiplier circuitry 210, LPF circuitry 212 and amplifier circuitry 214, can be fabricated using CMOS processing. Further, the delivered power detection circuitry 240 can utilize CMOS transistor devices and bipolar transistor devices, such as parasitic NPN devices, formed using CMOS processing. As such, all of the delivered power detection circuitry can be fabricated within the same integrated circuit, if desired. Further, if the PA circuitry is also fabricated using CMOS processing, the delivered power detection circuitry can also be integrated on the same integrated circuit die as the PA circuitry, if desired. Thus, the delivered power detection circuitry described herein can be integrated with the PA circuitry to form a single integrated circuit that provides the power amplifier functionality and the delivered power detection functionality. Alternatively, the PA circuitry and the delivered power detection circuitry can also be fabricated as separate integrated circuits and then combined into the same semiconductor package, for example, as a multi-chip module. This alternative solution would still provide a single semiconductor package solution.

Advantageously, the delivered power detection systems and methods described herein allow for reduced cost and reduced size requirements by eliminating the requirement of a separate RF coupler and allowing the PA functionality and delivered power functionality to be included within the same package and/or integrated within the same integrated circuit. Dotted line 250 in FIG. 2 represents an example for the circuitry that can be included within the same semiconductor package and/or within the same integrated circuit, if desired.

It is further noted that CMOS PAs that may utilized in the embodiments described herein include CMOS PAs described in the following applications: U.S. patent application Ser. No. 12/151,199, entitled "Controlling Power with an Output Network" and filed May 5, 2008 (now published as U.S. Published Patent Application 2009-0273397), and U.S. patent application Ser. No. 12/151,812, entitled "Supply Control For Multiple Power Modes Of A Power Amplifier" and filed May 8, 2008 (now published as U.S. Published Patent Application 2009-0278609), each of which is hereby incorporated by reference in its entirety.

FIG. 3 is a diagram of an example embodiment 300 for voltage detection circuitry that can be used with the delivered power detector embodiment of FIG. 2. As depicted, the output stages of the PA 104 include an amplifier stage 301 that provides differential signals 302 and 304 to a transformer stage 306. The resulting output of PA 104 from this transformer stage 306 provides a transmit signal 110 and an output ground 305. The load 325, which can include an antenna 108, is coupled between the transmit signal 110 and output ground 305.

Looking further to FIG. 3, signal (V+) 302 is provided to node 309 through capacitor (C1) 308. Node 309 is biased through a resistor to a voltage bias level (Vbias). Node 309 is also coupled to the gate of transistor 312. Transistor 312 has its source connected to ground, and the drain of transistor 312 provides a positive side differential output signal (Iv+) 318. Signal (V−) 304 is provided to node 311 through capacitor (C1) 310. Node 311 is biased through a resistor to a voltage bias level (Vbias). Node 311 is also coupled to the gate of transistor 314. Transistor 314 has its source connected to ground. The drain of transistor 314 provides a negative side differential output signal (Iv−) 320. A capacitor (C2) 316 is also coupled between nodes 309 and 311. A differential output current signal 322 indicative of the detected voltage level is provided by positive side differential output signal (Iv+) 318 and negative side differential output signal (Iv−) 320. The differential output current signal 322 is indicative of the detected voltage level and can be represented by (Iv+−Iv−)=(V+−V−)*[C1/(C1+2C2)]*gm, where gm represents the gain of the differential amplifier formed by transistors 312 and 314.

FIG. 4 is a diagram of an example embodiment 400 for current detection circuitry that can be used for the delivered power detector of FIG. 2. As depicted, the transmit signal 110 is provided through the switch circuitry (SW) 106 to the antenna 108, which is the load in this embodiment. An inductor (L2) 405, such a 1 nH, is provided in close proximity to the signal line carrying the transmit signal 110. The signal line can be effectively treated as a small inductor (L1) 407, such as 100 pH. In operation, the small inductor (L1) 407 induces a current in the larger inductor (L2) 405 and thereby provides a current between nodes 402 and 404. A resistor (Rt) 406 and a capacitor (Ct) 408 are also coupled between nodes 402 and 404, and a voltage difference is generated between these two nodes based upon the current generated by inductor (L2) 405. This voltage difference is used as a differential input to transistors 414 and 416.

Looking further to FIG. 4, node 402 is coupled to the gate of transistor 414 to provide a positive differential voltage input (V+). The gate of transistor 414 is also biased through a resistor to a voltage bias (Vbias). The source of transistor 414 is coupled to ground, and its drain provides the positive side differential output signal (Ii+) 418. Node 404 is coupled to the gate of transistor 416 to provide a negative differential voltage (V−). The gate of transistor 416 is biased through a resistor to a voltage bias (Vbias). The source of transistor 416 is coupled to ground, and its drain provides the negative side differential output signal (Ii−) 420. A, differential output current signal 422 indicative of the detected current level is provided by positive side differential output signal (Ii+) 418 and negative side differential output signal (Ii−) 420. The differential output current signal 422 indicative of the detected current level can be represented by (Ii+−Ii−)=(V+−V−)*gm, where gm represents the gain of the differential amplifier formed by transistors 414 and 416. It is noted that the voltage bias levels (Vbias) in FIGS. 3 an 4, as well as those represented in FIG. 6, can be different voltage bias levels, as desired.

FIG. 5 is a diagram of an example embodiment 500 for coupled inductors for a delivered power detector. The primary signal line 502 for the transmit signal 110 can be constructed such that it essentially provides a low value inductance (L1). The current through this primary signal line 502 represents the primary current (Ip) for the coupled inductors. The secondary signal line 504 can be constructed to provide a much higher inductance (L2). The current through this secondary signal line 504 represents the secondary current (Is) for the coupled inductors that is induced by the transmit signal 110 flowing through the primary inductor (L1). This construction for the coupled inductors can provide very low insertion loss with respect to the transmit signal 110 traveling through the primary signal line 502.

It is further noted that with the coupled inductors (L1 and L2), such as depicted in FIG. 4, a voltage (Vi) is induced on the secondary line as follows: Vi=(V+−V−)=s(Lm)ip, wherein Lm=K*Sqrt(L1*L2). Lm refers to mutual inductance, and K is coupling coefficient. If the secondary line is terminated in a short and the second inductor (L2) is ideal, the secondary current can be represented as follows: Is=(sLm/sL2)*ip=(Lm/L2)*ip. This secondary current (Is) is proportional to the current level for the transmit signal that is being detected in FIG. 2. Considering losses (Rind) and a termination resistor (Rt) 406, the secondary current (Is) through inductor (L2) 405 can be represented as follows:

$$Is=[sLm/(sL2+Rind+Rt)]*Ip$$

If (Rind+Rt) is much less than sL2 at frequencies of interest, Is will be proportional to Ip with some phase shift. A capacitor (Ct) 408 can be placed across resistor (Rt) 406 to help compensate for the phase shift at the desired operating frequencies such that:

$$Is=[sLm/(sL2+Rind+Rt/(1+sRtCt))]*Ip$$

FIG. 6 is a diagram of an embodiment 600 for multiplier circuitry that can be used for the current signals associated with the voltage and current detection circuitry of FIGS. 3-4. The circuitry of FIG. 6 is based upon a Gilbert current multiplier, which is a well-known current multiplier. The differential current signals 322 and 422 from FIGS. 3 and 4, respectively, provide the input signals for the embodiment 600. The embodiment 600 provides a current multiplier for these current input signals. It is noted that although a Gilbert current multiplier is depicted that utilizes bipolar devices, other RF multiplier circuitry could also be used such as an CMOS multiplier circuitry that utilizes only CMOS devices. Other multiplier implementations could also be utilized, if desired.

Looking more particularly to the embodiment depicted in FIG. 6, the positive side differential output signal (Iv+) 318 relating to the detected voltage level is coupled to node 602. The negative side differential output signal (Iv−) 320 relating to the detected voltage level is coupled to node 604. Node 602 is coupled to the emitter of transistor 612, and node 604 is coupled to the emitter of transistor 614. Transistors 612 and 614 have their bases and collectors coupled together to a voltage bias (Vbias). Node 602 is also coupled to the bases of transistors 616 and 622. Node 604 is also coupled to the bases of transistors 618 and 620.

The positive side differential output signal (Ii+) 418 relating to the detected current level is coupled to node 606. Node 606 is also coupled to the emitters of transistors 616 and 618. The negative side differential output signal (Ii−) 420 relating to the detected current level is coupled to node 608. Node 608 is also coupled to the emitters of transistors 620 and 622. The collectors of transistors 616 and 620 are coupled to node 624. Node 624 is also coupled to a voltage node, such as a supply voltage node (Vcc), through a resistor (R) and a capacitor (C) connected in parallel. The collectors of transistors 618 and 622 are coupled to node 626. Node 626 is also coupled to a voltage node (Vcc), such as a supply voltage node (Vcc), through a resistor (R) and a capacitor (C) connected in parallel. Nodes 624 and 626 provide a differential input signal to amplifier (Av) 628, which in turn provides a voltage output (Vout) signal that is proportional to the delivered power (Pd) 122.

It is noted that the bipolar NPN transistors depicted in FIG. 6 can be fabricated using CMOS processing, such as a 0.18 micron CMOS process, using a deep N-well as the collector for the bipolar transistors. In particular, parasitic NPN devices formed during the CMOS processing can be used as the bipolar transistors in the Gilbert cell multiplier of FIG. 6. By using these CMOS parasitic NPN devices as the bipolar transistors, the multiplier circuitry can be fabricated using CMOS processing and can be integrated on the same die as other CMOS circuitry, such as PA circuitry that is also fabricated using CMOS processing.

Because multiplication is done in the current domain by the circuitry of FIG. 6 and because the collector nodes of the NPN devices in FIG. 6 are at low frequencies, these bipolar devices can provide adequate performance at high frequencies, such as at frequencies of about 0.8 GHz or above. For example, this circuitry can perform with about 4 dB attenuation at 2 GHz. As such, the transmit signal and the output signals from the voltage detection circuitry and the current detection circuitry can be at frequencies of about 0.8 GHz or above, if desired, while still providing adequate performance.

It is noted that various alternatives and modifications can be made with respect to the circuitry of FIGS. 3-6, as desired. For example, it is noted that the voltage detection circuitry can also be implemented to include a capacitor sensor in the voltage path, if desired. It is also noted that the output signals from the voltage detection circuitry and the current detection circuitry may include an undesirable phase shift with respect to each other. As such, circuitry can be included to correct these phase shift errors, if desired. It is further noted that single-ended voltage detection circuitry and current detection circuitry could also be used, if desired. For example, single-ended voltage detection circuitry 202 could be provided at the RF output. This voltage detection circuitry could also be followed by a single-ended to differential converter, if differential multiplier circuitry were desired to be used. The current detection circuitry 204 could also be implemented in different ways. For example, only a single turn for L2 could be used instead of the multiple turns shown in FIG. 5. As a further example, the differential amplifiers provided by transistor 312 and 314 in FIG. 3 and transistors 414 and 416 in FIG. 4 can be removed such that signals provided to these differential amplifiers would instead be provided directly to the multiplier circuitry of FIG. 6.

FIG. 7 is a diagram of an embodiment 700 for an alternative implementation for the current detector circuitry 702 and the voltage detector circuitry 704. For this embodiment 700, the voltage detection circuitry 704 receives a single-ended input from the transmit signal 110 and outputs a differential current signal 712 to the multiplier circuitry 714. The current detection circuitry 702 detects a current signal between the PA circuitry 104 and ground 305, and it outputs a differential current signal 710 to the multiplier circuitry 714.

As with FIG. 3, the PA 104 in FIG. 7 includes an amplifier stage 301 that provides differential signals to a transformer stage 306. The resulting output of PA 104 from this transformer stage 306 provides a transmit signal 110 and an output ground 305. The load 325, which can include an antenna, is coupled between the transmit signal 110 and output ground 305. In contrast with FIG. 3, however, the voltage detector 704 in FIG. 7 is single-ended and is coupled to receive the transmit signal 110. As depicted, the transmit signal 110 is passed through resistor 706 and capacitor 708, which are coupled in parallel to provide a phase shift to the transmit signal 110. The resulting signal is provided to a single-ended to differential converter 706 that outputs the Iv+ and Iv− signals 712 through resistors to a Gilbert cell multiplier 714, which can be implemented with circuitry similar to the circuitry depicted in FIG. 6.

In contrast with FIG. 4, the current detector 702 is coupled to receive an induced current by being coupled between ground 305 and the transformer stage 306. The resulting signal produced by the induced current provides the Ii+ and Ii− signals 710 through resistors to the Gilbert cell multiplier 714, which as stated above can be implemented with circuitry similar to the circuitry depicted in FIG. 6.

The Gilbert cell multiplier 714 multiplies the current-related current input signal 710 from the current detector 702 and the voltage-related current input signal 712 voltage detector 704 to produce output current signal (Iout) 711, which can also be a differential current signal (I+ and I−). As described above, the output current signal (Iout) 711 is proportional to the actual delivered power (Pd). As also described above, this output current signal (Iout) 711 from the Gilbert cell multiplier 714 can also include baseband frequencies that can be more easily used by a host processor. This output current signal (Iout) 711 can also be filtered and amplified, if desired, to provide a voltage signal at baseband.

It is again noted that different implementations, both single-ended and/or differential, could also be used for the delivered power detection circuitry while still providing an output signal representing the actual delivered power to the load. As such, it is understood that the embodiments for the delivered power detection circuitry as described herein, including embodiments depicted for the voltage detection circuitry, the current detection circuitry and the multiplier circuitry, are only example embodiments, and other implementations, both single-ended and/or differential, can be utilized if desired.

FIG. 8 is a diagram of an example embodiment for a system 800 including delivered power detection circuitry 240. As depicted, a host processor 806 provides a transmit (TX) signal 802 to the power amplifier (PA) 104, which in turn produces the amplified transmit signal 110 that can be provided to a load, such as an antenna. The host processor 806 also includes a transmit (TX) power control block 808 that operates to control the transmit power provided to the ultimate load for the system 800. As depicted, the TX power control block 808 utilizes the delivered power output signal 216 from the delivered power detection circuitry 240 as part of a power control loop for determining the transmit power. The transmit power can be controlled, for example, using an optional transmit power (TX PWR) control signal 804 applied to the PA 104 by the host TX power control block 808. Many GSM-based systems utilize such a transmit power (TX PWR) control signal 804. The transmit power could also be controlled by directly adjusting the power of the TX signal 802. Many WCDMA-based systems control transmit power using this technique. Other techniques or combinations of techniques could also be used, as desired, to control the transmit power based upon the delivered power output signal 216.

As depicted, the delivered power detection circuitry 240 includes voltage detection circuitry 202 and current detection circuitry 204 that provide output signals to multiplier circuitry 210. As described above, the output signals from the voltage detection circuitry 202 and current detection circuitry 204 can be at high RF frequencies (e.g., frequencies of about 0.8 GHz or above). As also described above, the output signals 211 from the multiplier circuitry 210 can include baseband frequencies and second harmonic frequencies. The output signals from the multiplier circuitry 210 can also be filtered using filter 212 and amplified using amplifier 214, if desired, to produce a delivered power output signal 216 for the host processor 806 that represents average delivered power to the load. As described above, by including baseband frequencies, the output signals 211 from the multiplier circuitry 210 and the delivered power output signal 216 are more easily received and used by the host processor 806, or other baseband processing circuitry.

It is again noted that the PA circuitry 104 and delivered power detection circuitry 240 can be integrated within the same integrated circuit 250 using CMOS processing, if desired, or can alternatively be implemented as different CMOS integrated circuits that are combined into the same semiconductor package, if desired. Further, it is noted that the delivered power detection circuitry 240 could also be integrated within the host processor 806, if desired, rather than being integrated with the PA circuitry 104. Further, the PA circuitry 104 and the delivered power detection circuitry 240 could both be integrated with the host processor 806 for a single-chip solution, if desired. For this single-chip solution, as well as the combined integrated circuit 250, isolation circuitry and/or isolation techniques can also be used, as desired, to reduce interference that may be introduced by having the PA circuitry 104, the delivered power detection circuitry 240 and/or the host processor circuitry 806 on the same integrated circuit. Advantageously, the PA circuitry 104, the delivered power detection circuitry 240 and the host processor circuitry 806 can all be fabricated using CMOS processing, if desired.

FIG. 9 is a process flow diagram of an example embodiment 900 for controlling transmit output power using a delivered power output signal. In block 902, a transmit (TX) signal is received by the power amplifier. In block 904, the TX signal is amplified. In block 906, the voltage associated with the output signal is detected, and in block 908, the current associated with the output signal is detected. In block 910, the delivered power output signal is generated, and this delivered power output signal represents the delivered power (Pd) as represented by the incident power (Pi) reduced by the reflected power (Pr). In block 912, the delivered power output signal is used to control the transmit output. Flow then passes back to block 902.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. A system for providing radio frequency (RF) transmit signals, comprising:
    power amplifier circuitry configured to output an RF transmit signal to a load; and
    delivered power detection circuitry configured to detect power delivered by the RF transmit signal to the load and to provide an output signal indicative of the power delivered, the output signal being representative of incident power to the load reduced by reflected power, the delivered power detection circuitry comprising:
        voltage detection circuitry configured to detect a voltage level associated with a signal line for the RF transmit signal; and
        current detection circuitry configured to detect a current associated with a signal line for the RF transmit signal;
        wherein the current detection circuitry comprises an inductor in proximity to the signal line for the RF transmit signal such that a current is induced by the signal line in the inductor during operation; and
        wherein the current detection circuitry is further configured to output a differential current signal representative of the current level associated with the signal line for the RF transmit signal.

2. The system of claim 1, further comprising a host processor configured to receive the output signal from the delivered power detection circuitry, the host processor having a power control loop configured to use the output signal to control transmit power provided by the power amplifier circuitry to the load.

3. The system of claim 1, wherein the load comprises an antenna.

4. The system of claim 1, further comprising multiplier circuitry coupled to receive an output signal from the voltage detection circuitry and an output signal from the current detection circuitry, the multiplier circuitry being configured to provide a combined output signal indicative of the delivered power.

5. The system of claim 4, wherein the output signal from the voltage detection circuitry and the output signal from the current detection circuitry comprise current signals.

6. The system of claim 5, wherein the output signal from the multiplier circuitry further comprises a current signal.

7. The system of claim 6, wherein the multiplier circuitry comprises bipolar transistors.

8. The system of claim 6, wherein the RF transmit signal and the output signals from the voltage detection circuitry and the current detection circuitry are configured to be at about 0.8 GHz or above, and wherein the output signals from the multiplier circuitry include baseband frequencies.

9. The system of claim 1, wherein the voltage detection circuitry is configured to receive differential voltages from the power amplifier circuitry and to output a differential current signal representative of the voltage level associated with the signal line for the RF transmit signal.

10. The system of claim 1, wherein the voltage detection circuitry is configured to receive a single-ended voltage from the signal line for the RF transmit signal.

11. The system of claim 1, wherein the power amplifier circuitry and the delivered power detection circuitry are included with the same semiconductor package.

12. The system of claim 1, wherein the power amplifier circuitry and the delivered power detection circuitry are integrated within the same integrated circuit.

13. The system of claim 12, wherein the power amplifier circuitry and the delivered power detection circuitry are fabricated using CMOS processing.

14. The system of claim 13, wherein the delivered power detection circuitry comprises bipolar transistors formed as parasitic NPN devices during the CMOS processing.

15. The system of claim 1, wherein the RF transmit signal is configured to be at a frequency of about 0.8 GHz or above, and wherein the output signal indicative of the power delivered is at baseband.

16. A delivered power detector for radio frequency (RF) transmit signals, comprising:
- voltage detection circuitry configured to detect a voltage level associated with a signal line for an RF transmit signal; and
- current detection circuitry configured to detect a current associated with a signal line for the RF transmit signal;
- output circuitry configured to receive an output signal from the voltage detection circuitry, to receive an output signal from the current detection circuitry and to provide an output signal indicative of the power delivered, the output signal being representative of incident power to the load reduced by reflected power;
- wherein the current detection circuitry comprises an inductor in proximity to the signal line for the RF transmit signal such that a current is induced by the signal line in the inductor during operation; and
- wherein the current detection circuitry is further configured to output a differential current signal representative of the current level associated with the signal line for the RF transmit signal.

17. The delivered power detector of claim 16, wherein the output circuitry comprises multiplier circuitry coupled to receive the output signal from the voltage detection circuitry and the output signal from the current detection circuitry, the multiplier circuitry being configured to provide a combined output signal indicative of the delivered power.

18. The delivered power detector of claim 17, wherein the output signal from the voltage detection circuitry and the output signal from the current detection circuitry comprise current signals.

19. The delivered power detector of claim 18, wherein the output signal from the multiplier circuitry also comprises a current signal.

20. The delivered power detector of claim 19, wherein the output signals from the voltage detection circuitry and the current detection circuitry are configured to be at about 0.8 GHz or above, and wherein the output signals from the multiplier circuitry are configured to include baseband frequencies.

21. The delivered power detector of claim 16, wherein the delivered power detection circuitry is fabricated using CMOS processing.

22. The delivered power detector of claim 21, wherein the delivered power detection circuitry comprises bipolar transistors formed as parasitic NPN devices during the CMOS processing.

23. The delivered power detector of claim 16, wherein the RF transmit signal is configured to be at a frequency of about 0.8 GHz or above, and wherein the output signal indicative of the power delivered is at baseband.

24. A method for providing radio frequency (RF) transmit signals, comprising:
- generating an amplified RF transmit signal for a load using power amplifier circuitry;
- detecting a voltage level associated with a signal line for an RF transmit signal using voltage detection circuitry within delivered power detection circuitry;
- detecting a current level associated with a signal line for an RF transmit signal using current detection circuitry within the delivered power detection circuitry; and
- providing an output signal indicative of the power delivered using the delivered power detection circuitry, the output signal being representative of incident power to the load reduced by reflected power;
- wherein the current detection circuitry used in the detecting a current level step comprises an inductor in proximity to the signal line for the RF transmit signal such that a current is induced by the signal line in the inductor during operation; and
- wherein the current detection circuitry is configured to output a differential current signal representative of the current level associated with the signal line for the RF transmit signal.

25. The method of claim 24, further comprising using the output signal indicative of the power delivered to control transmit power to the load.

26. The method of claim 24, wherein the load comprises an antenna.

27. The method of claim 24, wherein the providing step comprises multiplying a signal indicative of the voltage level with a signal indicative of the current level to provide the output signal indicative of the power delivered.

28. The method of claim 27, wherein the signal indicative of the voltage level and the signal indicative of the current level comprise current signals.

29. The method of claim 28, wherein the output signal also comprises a current signal.

30. The method of claim 29, wherein the providing step utilizes bipolar transistors.

31. The method of claim 29, wherein the RF transmit signal, the signal indicative of the voltage level and the signal indicative of the current level are at a frequency of about 0.8 GHz or above, and wherein the output signal is at baseband.

32. The method of claim 24, wherein the detecting a voltage level step utilizes differential input voltages.

33. The method of claim 24, wherein the detecting a voltage level step utilizes a single-ended input voltage.

34. The method of claim 24, wherein the generating, detecting and providing steps are conducted within the same semiconductor package.

35. The method of claim 24, wherein the generating, detecting and providing steps are conducted within the same integrated circuit.

36. The method of claim 35, wherein the integrated circuit is fabricated using CMOS processing.

37. The method of claim 36, wherein the integrated circuit comprises bipolar transistors formed as parasitic NPN devices during the CMOS processing.

38. The method of claim 24, the generating step comprises generating an RF transmit signal at a frequency of about 0.8 GHz or above, and wherein the output signal indicative of the power delivered is at baseband.

* * * * *